US012543266B2

(12) United States Patent
Cheng

(10) Patent No.: US 12,543,266 B2
(45) Date of Patent: Feb. 3, 2026

(54) TRANSMISSION CABLE STRUCTURE

(71) Applicant: Elka International Ltd., New Taipei (TW)

(72) Inventor: Yi-Chieh Cheng, New Taipei (TW)

(73) Assignee: Elka International Ltd., New Taipei (TW)

( * ) Notice: Subject to any disclaimer, the term of this patent is extended or adjusted under 35 U.S.C. 154(b) by 352 days.

(21) Appl. No.: 18/212,502

(22) Filed: Jun. 21, 2023

(65) Prior Publication Data
US 2024/0276644 A1     Aug. 15, 2024

(30) Foreign Application Priority Data
Feb. 10, 2023   (TW) ................................. 112201202

(51) Int. Cl.
| H05K 1/14 | (2006.01) |
| H01R 12/53 | (2011.01) |
| H05K 1/11 | (2006.01) |
| H01R 13/6591 | (2011.01) |
| H05K 1/02 | (2006.01) |

(52) U.S. Cl.
CPC ............. *H05K 1/148* (2013.01); *H01R 12/53* (2013.01); *H05K 1/117* (2013.01); *H01R 13/65912* (2020.08); *H05K 1/0215* (2013.01); *H05K 2201/09227* (2013.01)

(58) Field of Classification Search
CPC ................................ H01R 1/148; H01R 12/53
USPC ............... 439/108, 497, 502, 607.01, 620.22
See application file for complete search history.

(56) References Cited

U.S. PATENT DOCUMENTS

| 4,490,775 A | 12/1984 | Quan | |
| 7,667,138 B2 * | 2/2010 | Koga | .................. H01R 12/594 |
| | | | 174/117 FF |
| 11,258,195 B2 * | 2/2022 | Kimura | .................. H05K 1/117 |
| 2017/0207589 A1 | 7/2017 | Wu et al. | |

OTHER PUBLICATIONS

The extended European serach report issued by European Patent Office on Dec. 14, 2023.

\* cited by examiner

*Primary Examiner* — Phuong K Dinh
(74) *Attorney, Agent, or Firm* — LANWAY IPR SERVICES; Chun-Ming Shih

(57) ABSTRACT

A transmission cable includes a transmission cable, a first circuit board having a first power layout area, a first ground layout area, and a first circuit trace, and a second circuit board having a second power layout area, a second ground layout area, and a second circuit trace. The transmission cable includes a power wire, a pair of signal wires, and a drain wire. When the first power layout area, the first circuit trace, the second power layout area, and the second circuit trace are connected via a resistor, respectively, the drain wire connected between the first circuit trace and the second circuit trace will act as another power wire. Thus, a voltage drop at both ends of the transmission cable can be reduced by increasing the power wires to improve signal transmission quality.

18 Claims, 8 Drawing Sheets

TRANSMISSION CABLE STRUCTURE

This non-provisional application claims priority claim under 35 U.S.C. § 119(a) on Taiwan Patent Application No. 112201202 filed Feb. 10, 2023, the entire contents of which are incorporated herein by reference.

FIELD OF THE INVENTION

This disclosure relates to a transmission cable structure, particularly to a transmission cable structure capable of reducing a voltage drop at both ends of a transmission cable.

BACKGROUND

Since the wire materials of the transmission cable have impedance, a voltage drop will be formed at both ends of the transmission cable. The voltage drop will be more noticeable when the transmission cable is longer. The excessive voltage drop will cause the level of the signal transmitted on the transmission cable is shifted or misaligned.

To reduce the voltage drop at both ends of the transmission cable, traditionally, metal wires with thicker diameters are adopted as the transmission cable. However, the metal wires with thicker diameters adopted will increase the material cost and the hardness of the transmission cable. The higher hardness transmission cable may have disadvantages, such as being difficult to bend and unsuitable for soldering on the PCB board of the connector, and it may also fail to meet the requirements of regulations.

For this reason, the disclosure provides an innovative transmission cable structure. In addition to the original power wire inside the transmission cable, a drain wire inside can also be designed as another power wire. Thus, by increasing the number of power wires, the voltage drop at both ends of the transmission cable can be effectively reduced to improve the quality of the signal transmission of the transmission cable, which will be the purpose of the disclosure.

SUMMARY

The disclosure aims to provide a transmission cable structure, which includes a first connector, a second connector, and a transmission cable. The transmission cable is disposed between the first connector and the second connector. The first connector is provided with a first circuit board inside. The second connector is provided with a second circuit board inside. The first circuit board includes a first power layout area, a first ground layout area, a first power trace, and a first circuit trace. The second circuit board includes a second power layout area, a second ground layout area, a second power trace, and a second circuit trace. The transmission cable includes a power wire, a pair of signal wires, and a conducting wire. The power wire is provided at two ends connected to the first power layout area and the second power layout area via the first power trace and the second power trace, respectively. The conducting wire is connected between the first circuit trace and the second circuit trace. The first resistor is configured between the first circuit trace and the first power layout area. The second resistor is configured between the second circuit trace and the second power layout area. Thus, the conducting wire can be electrically connected to the first power layout area and the second power layout area via the first circuit trace, the second circuit trace, the first resistor, and the second resistor so that the conducting wire becomes another power wire of the transmission cable. Accordingly, a voltage drop at both ends of the transmission cable can be reduced by increasing the number of the power wires to increase the quality of the signal transmission of the transmission cable.

To achieve the above objective, the disclosure provides a transmission cable structure, including: a first circuit board including a first power layout area, a first ground layout area, a first power trace, and a first circuit trace; a second circuit board including a second power layout area, a second ground layout area, a second power trace, and a second circuit trace; a transmission cable disposed between the first circuit board and the second circuit board, the transmission cable including: a power wire, connected between the first power trace of the first circuit board and the second power trace of the second circuit board, and electrically connected to the first power layout area via the first power trace, and electrically connected to the second power layout area via the second power trace; a pair of signal wires connected between signal traces of the first circuit board and signal traces of the second circuit board; and a conducting wire connected between the first circuit trace of the first circuit board and the second circuit trace of the second circuit board; a first resistor configured between the first circuit trace and the first power layout area; and a second resistor configured between the second circuit trace and the second power layout area.

In one embodiment of the discourse, the conducting wire is a drain wire.

In one embodiment of the discourse, the transmission cable further includes at least one braided metal wire, which is intertwined around the peripheries of the power wire, the conducting wire, and the pair of signal wires.

In one embodiment of the discourse, the first circuit board includes a first ground trace connected to the first ground layout area, the second circuit board includes a second ground trace connected to the second ground layout area, and the braided metal wire is connected between the first ground trace of the first circuit board and the second ground trace of the second circuit board.

In one embodiment of the discourse, the braided metal wire is connected to a grounded shell of a connector, or connected to a grounded metal body.

In one embodiment of the discourse, the first resistor and the second resistor are zero-ohm resistors or resistors close to zero-ohm.

The discourse further provides a transmission cable structure, including: a first circuit board including a first power layout area, a first ground layout area, a first power trace, and a first circuit trace; a second circuit board including a second power layout area, a second ground layout area, a second power trace, and a second circuit trace; a transmission cable disposed between the first circuit board and the second circuit board, the transmission cable including: a power wire, connected between the first power trace of the first circuit board and the second power trace of the second circuit board, and electrically connected to the first power layout area via the first power trace, and electrically connected to the second power layout area via the second power trace; a pair of signal wires connected between signal traces of the first circuit board and signal traces of the second circuit board; and a conducting wire connected between the first circuit trace of the first circuit board and the second circuit trace of the second circuit board; a first resistor configured between the first circuit trace and the first ground layout area; and a second resistor configured between the second circuit trace and the second ground layout area.

The discourse further provides a transmission cable structure, including: a first circuit board including at least one first power layout area, at least one first ground layout area, at least one first power trace, and a plurality of first circuit traces; a second circuit board including at least one second power layout area, at least one second ground layout area, at least one second power trace, and a plurality of second circuit traces; a transmission cable including: a power wire, connected between the first power trace and the second power trace, and electrically connected to the corresponding first power layout area via the first power trace, and electrically connected to the corresponding second power layout area via the second power trace; a plurality of pairs of signal wires, each of the plurality of pairs of signal wires are connected between signal traces of the first circuit board and signal traces of the second circuit board; and a plurality of conducting wires, each of the plurality of conducting wires is connected between the corresponding first circuit trace and the corresponding second circuit trace; a plurality of first resistors, each of the plurality of first resistors is selectively configured to be placed in one of an interval between the corresponding first circuit trace and the corresponding first power layout area and an interval between the corresponding first circuit trace and the corresponding first ground layout area; and a plurality of second resistors, each of the plurality of second resistors is selectively configured to be placed in one of an interval between the corresponding second circuit trace and the corresponding second power layout area, or configured between the corresponding second circuit trace and the corresponding second ground layout area.

In one embodiment of the discourse, wherein the first circuit board and the second circuit board are provided with a first surface and a second surface, respectively; the plurality of pairs of signal wires and the plurality of conducting wires are all connected between the first surface of the first circuit board and the first surface of the second circuit board.

In one embodiment of the discourse, the first circuit board and the second circuit board are provided with a first surface and a second surface, respectively; at least one of the plurality of pairs of signal wires and at least one of the plurality of conducting wires are connected between the first surface of the first circuit board and the first surface of the second circuit board; other pairs of signal wires and other conducting wires are connected between the second surface of the first circuit board and the second surface of the second circuit board.

In one embodiment of the discourse, the transmission cable structure conforms to USB, HDMI, or DisplayPort standard protocol.

DETAILED DESCRIPTION OF THE PREFERRED EMBODIMENTS

Figure 1:
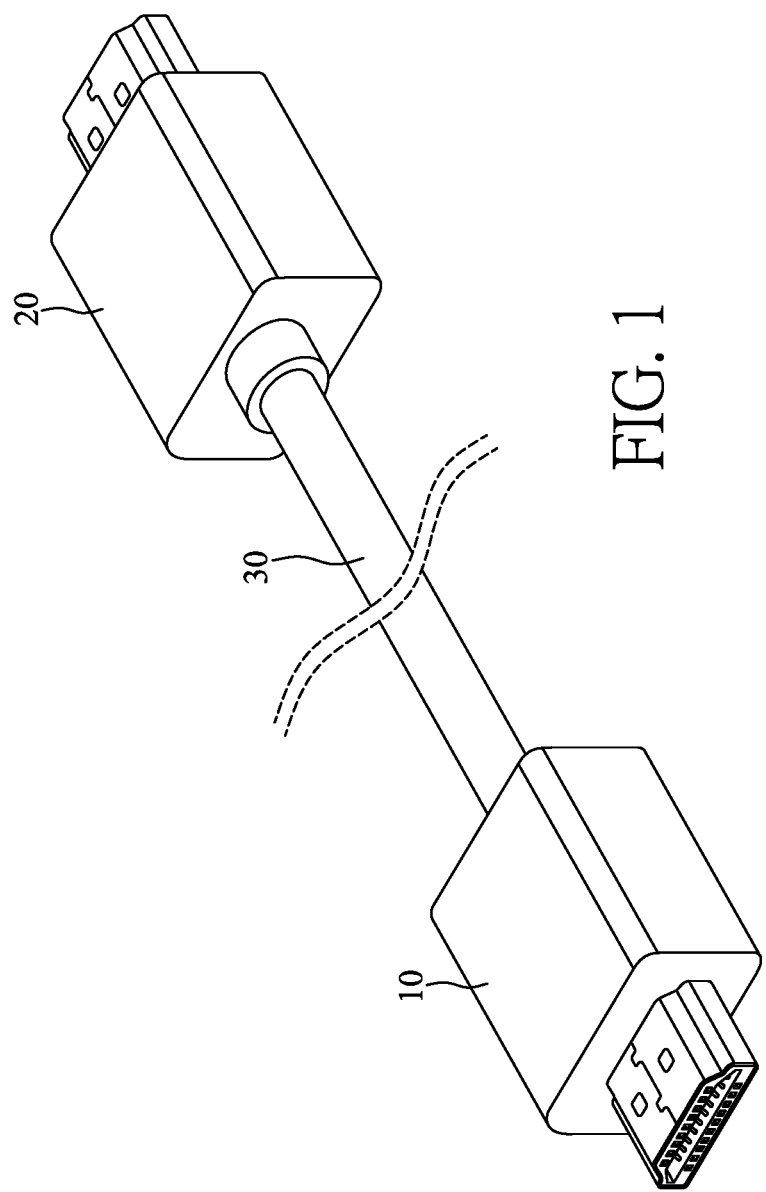
FIG. 1 is a stereoscopic view according to one embodiment of a transmission cable structure of the disclosure.
Figure 2:
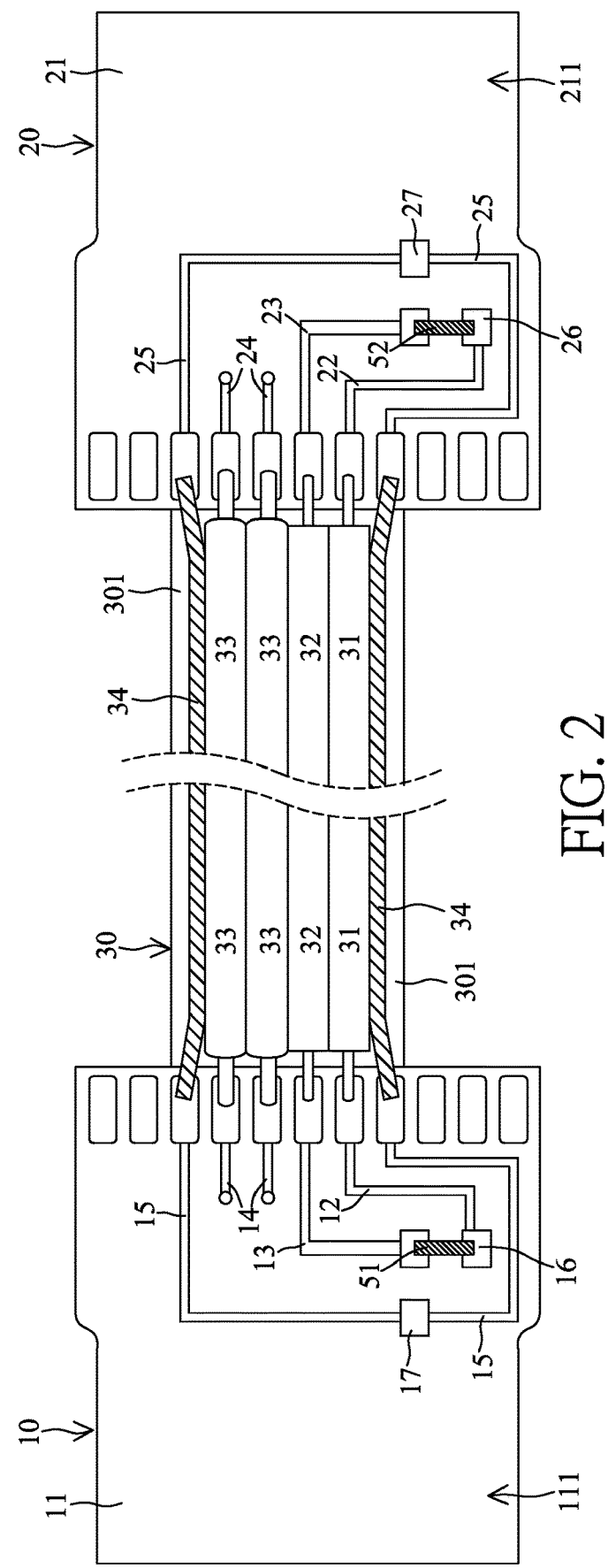
FIG. 2 is a circuit connection view according to one embodiment of the transmission cable structure of the disclosure.

Referring to FIG. 1 and FIG. 2, a stereoscopic view and a circuit connection view are displayed according to one embodiment of a transmission cable structure of the disclosure. As shown in FIG. 1, the transmission cable structure includes a first connector 10, a second connector 20, and a transmission cable 30.

As shown in FIG. 1 and FIG. 2, the first connector 10 includes a first circuit board 11 inside, and the second connector 20 includes a second circuit board 21 inside. At least one first power trace 12, at least one first circuit trace 13, at least two first signal traces 14, and at least one first ground trace 15 are configured on a first surface (such as upper surface) 111 of the first circuit board 11. At least one second power trace 22, at least one second circuit trace 23, at least two second signal traces 24, and at least one second ground trace 25 are configured on a first surface (such as upper surface) 211 of the second circuit board 21.

The first circuit board 11 and the second circuit board 21 are multilayer printed circuit boards, respectively. The first power trace 12, the first circuit trace 13, the first signal traces 14, and the first ground trace 15 can also be configured on the same layer or different layers; for example, the first power trace 12, the first circuit trace 13, part of the first signal traces 14, and the first ground trace 15 are configured on the same layer. The other part of the first signal traces 14 are configured on another layer. The first signal traces 14 on different layers are connected via at least one metal through hole. The second power trace 22, the second circuit trace 23, the second signal traces 24, and the second ground trace 25 can also be configured on the same layer or different layers; for example, the second power trace 22, the second circuit trace 23, part of the second signal traces 24, and the second ground trace 25 are configured on the same layer. The other part of the second signal traces 24 are configured on another layer. The second signal traces 24 on different layers are connected via at least one metal through hole.

The transmission cable 30 includes a power wire 31, a conducting wire 32, and a pair of signal wires 33. The transmission cable 30 is disposed between the first connector 10 and the second connector 20 through soldering. For example, the transmission cable 30 is provided with one end to be soldered on the first circuit board 11 of the first connector 10, and provided with another end to be soldered on the second circuit board 21 of the second connector 20. When the transmission cable 30 is disposed between the first connector 10 and the second connector 20, the power wire 31 is connected between the first power trace 12 and the second power trace 22. The conducting wire 32 is connected between the first circuit trace 13 and the second circuit trace 23. The signal wires 33 are connected between the first signal traces 14 and the second signal traces 24. In the disclosure, the conducting wire 32 is a drain wire.

The first circuit board 11 further includes at least one first power layout area 16 and at least one first ground layout area 17. The second circuit board 21 further includes at least one second power layout area 26 and at least one second ground layout area 27. The first power trace 12 is electrically connected to the first power layout area 16, and the second power trace 22 is connected to the second power layout area 26.

The transmission cable structure further includes at least one first resistor 51 and at least one second resistor 52. As shown in FIG. 2, in one preferred embodiment, the first resistor 51 is configured between the first circuit trace 13 and the first power layout area 16. The second resistor 52 is configured between the second circuit trace 23 and the second power layout area 26. Thus, the conducting wire 32 can be electrically connected to the power layout areas 16, 26 via the circuit traces 13, 23 and the resistors 51, 52 so that the conducting wire 32 can be acted as another power wire and connected with the original power wire 31 in parallel. In the disclosure, the first resistor 51 and the second resistor 52 are zero-ohm resistors or resistors close to zero-ohm, respectively.

The power wire 31 and the conducting wire 32 are made of metal wires (such as copper wires) with impedance. For example, the impedance of the power wire 31 is R1, and the impedance of the conducting wire 32 is R2. When the power wire 31 and the conducting wire 32 are connected in parallel, the impedance of the power wire 31 and the conducting wire 32 connected in parallel is $R_T = R_1 // R_2$. The impedance ($R_T$) obtained by R1 and R2 connected in parallel will be smaller than the individual impedance ($R_1$) or the individual impedance ($R_2$), for example, $R_T < R_1$ and $R_T < R_2$. In the transmission cable structure, if there is only one power wire, the voltage drop at both ends of the transmission cable 30 is $V_1 = I \times R_1$; if the number of the power wires is increased to two, the voltage drop at both ends of the transmission cable 30 is $V_2 = I \times R_T$. Since $R_T < R_1$, the voltage drop ($V_2$) is necessarily smaller than the voltage drop ($V_1$).

Accordingly, through the resistors 51, 52 to be configured between the circuit traces 13, 23 and the power layout areas 16, 26, the conducting wire 32 can be electrically connected to the power layout area 16, 26 to be acted as another power wire. Thus, by increasing the number of the power wires, the voltage drop at both ends of the transmission cable 30 can be reduced from V1 to V2 to improve the quality of signal transmission on the transmission cable 30. In the disclosure, the signal transmitted on the transmission cable 30 may be power signal or data signal.

The transmission cable 30 further includes at least one braided metal wire 34. The braided metal wire 34 is intertwined around the peripheries of the power wire 31, the conducting wire 32, and the signal wires 33. In one embodiment of the disclosure, the braided metal wire 34 is connected between the first ground layout area 17 of the first circuit board 11 and the second ground layout area 27 of the second circuit board 21. For example, the braided metal wire 34 is provided with one end to be soldered on the first ground trace 15 of the first circuit board 11 and provided with another end to be soldered on the second ground trace 25 of the second circuit board 21; the braided metal wire 34 is electrically connected to the first ground layout area 17 and the second ground layout area 27 via the first ground trace 15 and the second ground trace 25, respectively, so that the braided metal wire 34 acts as a ground wire of the transmission cable 30. In another embodiment of the disclosure, the braided metal wire 34 is provided with two ends connected to the metal shells of connectors 10, 20, respectively, and grounded via the metal shells of the connectors 10, 20. In another embodiment of the disclosure, the braided metal wire 34 is provided with one end connected to a metal body and grounded via the metal body.

The transmission cable 30 further includes a sheath 301. The sheath 301 is wrapped around the braided metal wire 34 to protect the power wire 31, the conducting wire 32, and the signal wires 33 inside the braided metal wire 34.

Figure 3:
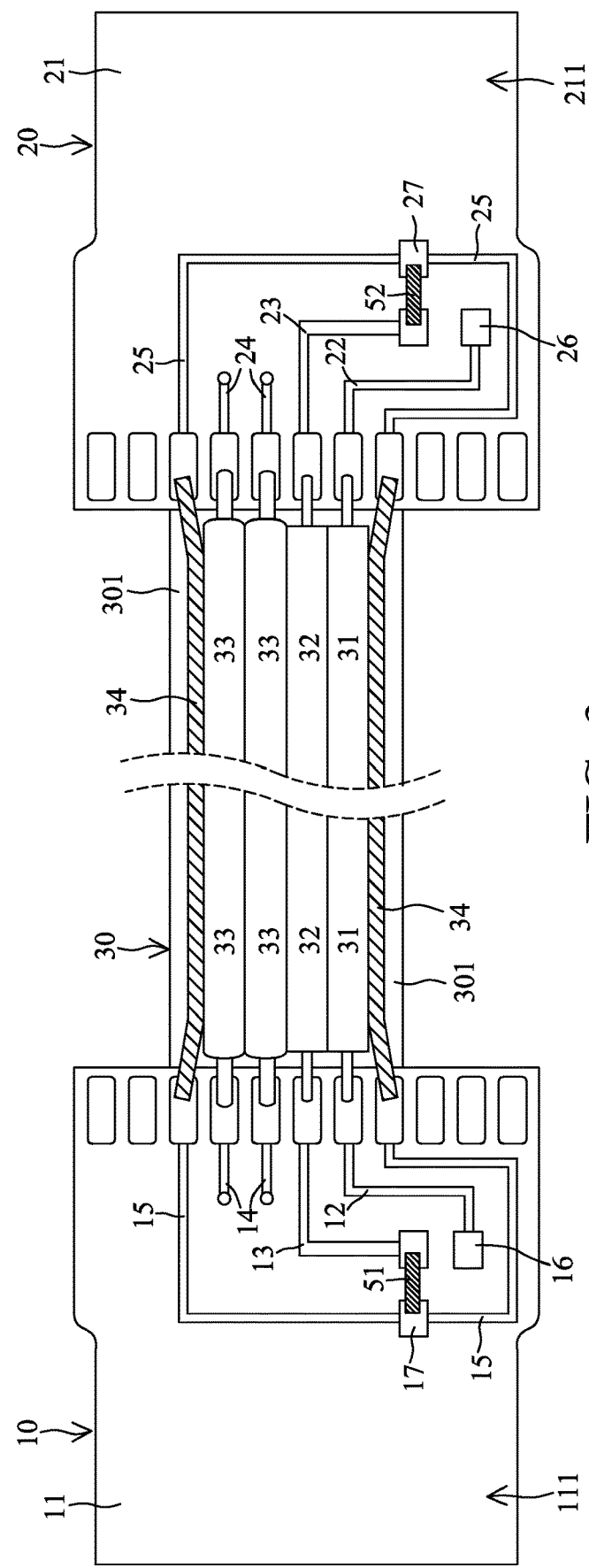
FIG. 3 is a circuit connection view according to another embodiment of the transmission cable structure of the disclosure.

Referring to FIG. 3, a circuit connection view is shown according to another embodiment of the transmission cable structure of the disclosure. As shown in FIG. 3, in the transmission cable structure of the present embodiment, the first resistor 51 may be configured between the first circuit trace 13 and the first ground layout area 17, and the second resistor 52 may be configured between the second circuit trace 23 and the second ground layout area 27. The circuit traces 13, 23 corresponding to the conducting wire 32 are electrically connected to the ground layout areas 17, 27 via the corresponding resistor 51, 52 to make that the conducting wire 32 can become another ground wire.

Accordingly, by changing the positions of the resistors 51, 52, the conducting wire 32 can be optionally connected to the power layout areas 16, 26, or optionally connected to the ground layout areas 17, 27 to determine that the conducting wire 32 is used to act as the power wire or the ground wire.

Figure 4:
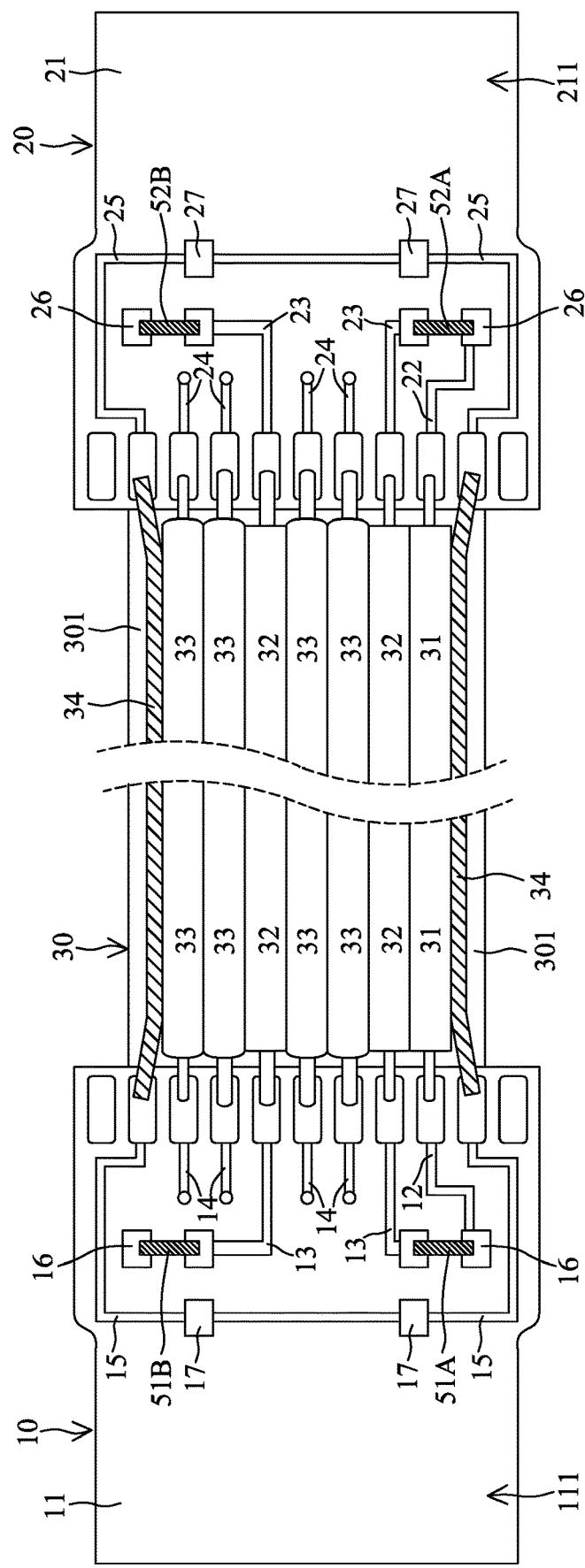
FIG. 4 is a circuit connection view according to another embodiment of the transmission cable structure of the disclosure.

Referring to FIG. 4, there is shown a circuit connection view according to another embodiment of the transmission cable structure of the disclosure. As shown in FIG. 4, in order to increase the transmission capacity of signal, the transmission cable 30 of the present embodiment is further provided with two pairs of signal wires 33. Each pair of the signal wires 33 will be correspondingly matched with a conducting wire 32.

Each pair of the signal wires 33 is connected between the corresponding first signal traces 14 and the corresponding signal traces 24. Each conducting wire 32 is connected between the corresponding first circuit trace 13 and the corresponding second circuit trace 23.

The transmission cable structure of the present embodiment further includes at least two first resistors 51A, 51B and at least two second resistors 52A, 52B. The two first resistors 51A, 51B are configured between the corresponding first circuit traces 13 and the corresponding first power layout areas 16. The two second resistors 52A, 52B are configured between the corresponding second circuit traces 23 and the corresponding second power layout areas 26. Thus, the two conducting wires 32 are connected to the corresponding power layout areas 16, 26 via the corresponding circuit traces 13, 23 and the resistors 51A, 51B, 52A, 52B, and therefore used to be acted as the power wires.

Figure 5:
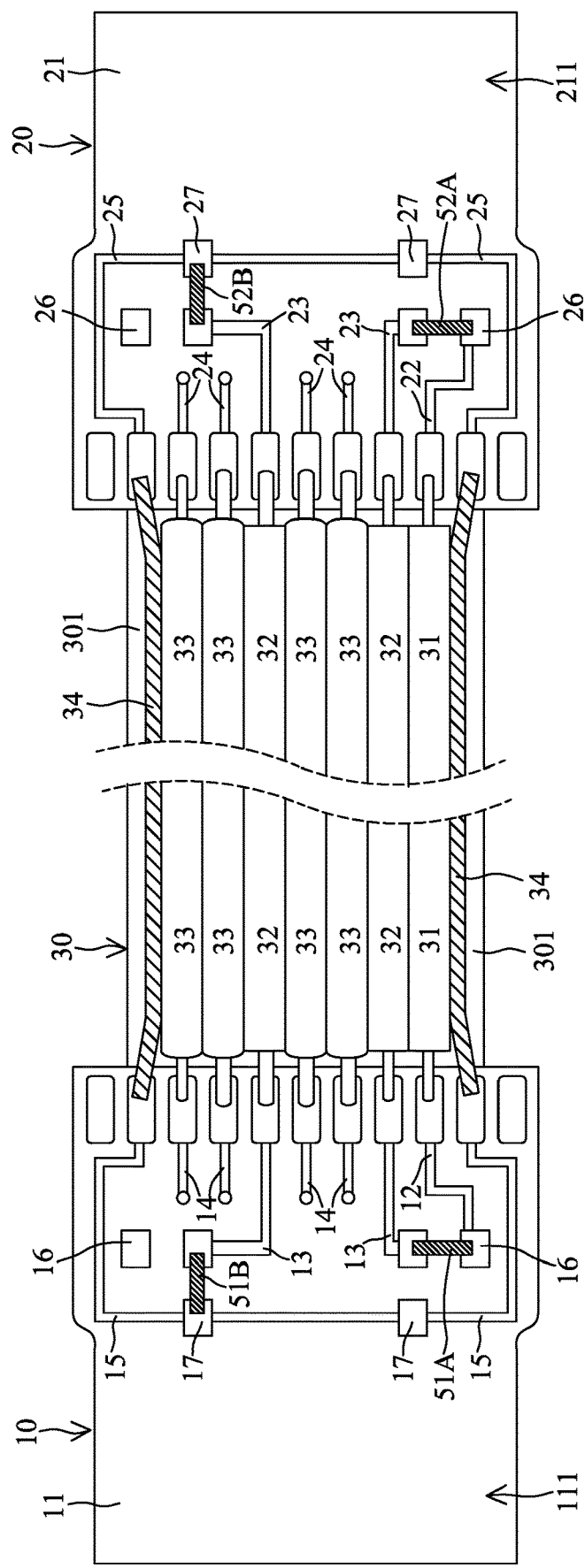
FIG. 5 is a circuit connection view according to another embodiment of the transmission cable structure of the disclosure.

As shown in FIG. 5, in another embodiment of the disclosure, the first resistor 51A is configured between the corresponding first circuit trace 13 and the corresponding first power layout area 16, and the second resistor 52A is configured between the corresponding second circuit trace 23 and the corresponding second power layout area 26; the first resistor 51B is configured between the corresponding first circuit trace 13 and the corresponding first ground layout area 17, and the second resistor 52B is configured between the corresponding second circuit trace 23 and the corresponding second ground layout area 27. Thus, one of the two conducting wires 32 is electrically connected to the power layout areas 16, 26 via the circuit traces 13, 23 and the resistors 51A, 52A, and used to be acted as the power wire; the other conducting wire 32 is electrically connected to the ground layout areas 17, 27 via the circuit traces 13, 23 and the resistors 51B, 52B, and therefore used to be acted as the ground wire.

Figure 6:
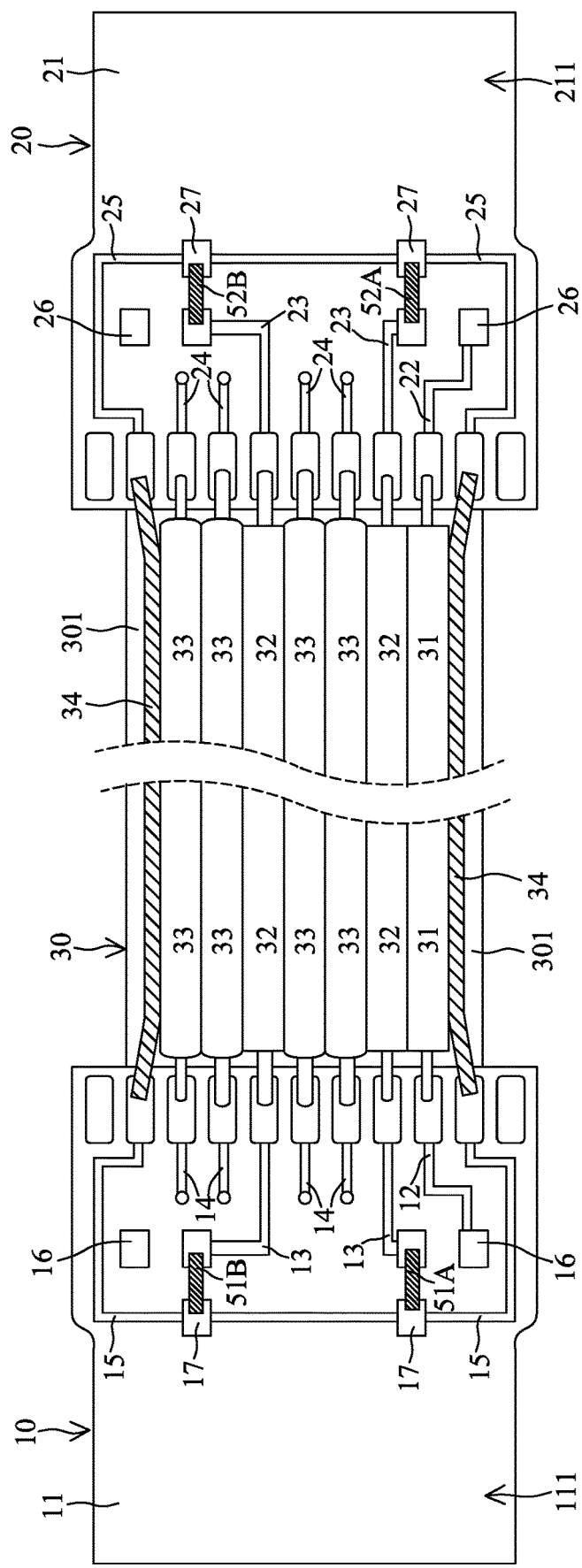
FIG. 6 is a circuit connection view according to another embodiment of the transmission cable structure of the disclosure.

As shown in FIG. 6, in another embodiment of the disclosure, the first resistor 51A is configured between the corresponding first circuit trace 13 and the corresponding first ground layout area 17, and the second resistor 52A is configured between the corresponding second circuit trace 23 and the corresponding second ground layout area 27; the first resistor 51B is configured between the corresponding first circuit trace 13 and the corresponding first ground layout area 17, and the second resistor 52B is configured between the corresponding second circuit trace 23 and the corresponding second ground layout area 27. Thus, the two conducting wires 32 are electrically connected to the ground layout areas 17, 27 via the circuit traces 13, 23 and the resistors 51A, 51B, 52A, 52B, and therefore used to be acted as the ground wires.

Figure 7:
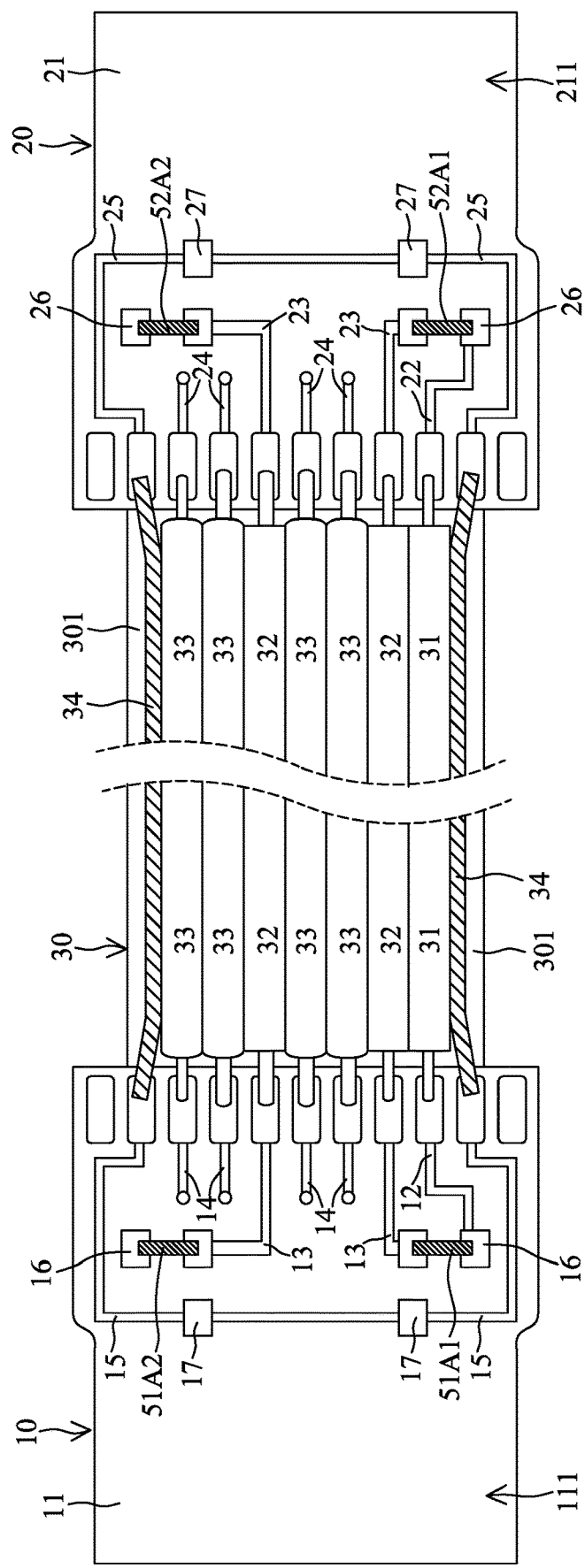
FIG. 7 is a circuit connection view on a surface according to another embodiment of the transmission cable structure of the disclosure.
Figure 8:
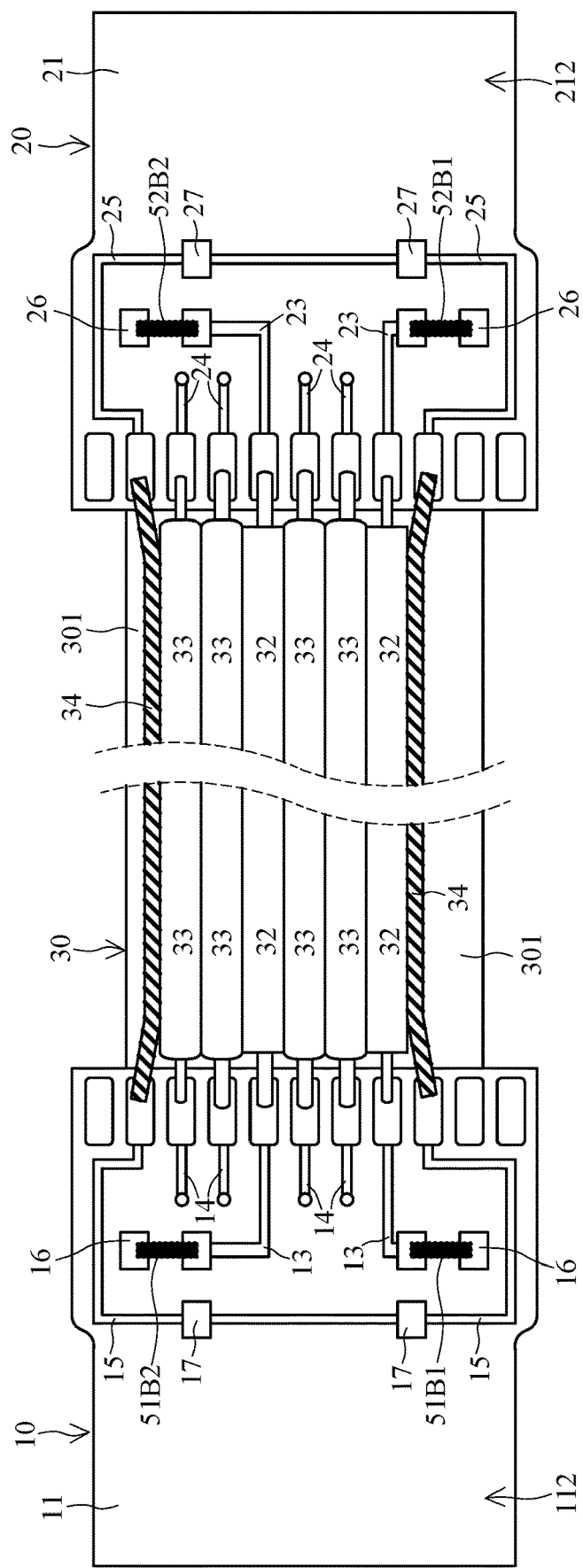
FIG. 8 is a circuit connection view on another surface according to another embodiment of the transmission cable structure of the disclosure.

Referring to FIG. 7 and FIG. 8, a circuit connection view on a surface and a circuit connection view on another surface are shown according to another embodiment of the transmission cable structure of the disclosure. In the transmission cable structure of the present embodiment, in addition to the upper surfaces (such as the first surface 111, 211) of the first circuit board 11 and the second circuit board 21 to be soldered with the signal wires 33 and the conducting wires 32 thereon, the lower surfaces (the second surfaces 112, 212) of the first circuit board 11 and the second circuit board 21 are also soldered with the signal wires 33 and the conducting wires 32 thereon.

As shown in FIG. 7 and FIG. 8, similar to the first surface 111 of the first circuit board 11, the second surface 112 of the first circuit board 11 also includes at least one first circuit trace 13, at least two first signal traces 14, at least one first ground trace 15, at least one first power layout area 16, and at least one first ground layout area 17; similar to the first surface 211 of the second circuit board 21, the second surface 212 of the second circuit board 21 also includes at least one second circuit trace 23, at least two second signal traces 24, at least one second ground trace 25, at least one second power layout area 26, and at least one second ground layout area 27.

As shown in FIG. 8, on the second surface 112 of the first circuit board 11 and the second surface 212 of the second circuit board 21, each of the pairs of signal wires 33 are connected between the corresponding first signal traces 14 and the corresponding second signal traces 24, and each of the conducting wires 32 is connected between the corresponding first circuit trace 13 and the corresponding second circuit trace 23.

As shown in FIG. 7, on the first surface 111 of the first circuit board 11 and the first surface 211 of the second circuit board 21, one of the two conducting wires 32 is electrically connected to the power layout areas 16, 26 via the corresponding circuit traces 13, 23 and the corresponding resistors 51A1, 52A1 to be acted as the power wire, or electrically connected to the ground layout areas 17, 27 via the corresponding circuit traces 13, 23 and the corresponding resistors 51A1, 52A1 to be acted as the ground wire; the other conducting wire 32 is electrically connected to the power layout areas 16, 26 via the corresponding circuit traces 13, 23 and the corresponding resistors 51A2, 52A2 to be acted as the power wire, or electrically connected to the ground layout areas 17, 27 via the corresponding circuit traces 13, 23 and the corresponding resistors 51A2, 52A2 to be acted as the ground wire.

As shown in FIG. 8, on the second surface 112 of the first circuit board 11 and the second surface 212 of the second circuit board 21, one of the two conducting wires 32 is electrically connected to the power layout areas 16, 26 via the corresponding circuit traces 13, 23 and the corresponding resistors 51B1, 52B1 to be acted as the power wire, or electrically connected to the ground layout areas 17, 27 via the corresponding circuit traces 13, 23 and the corresponding resistors 51B1, 52B1 to be acted as the ground wire; the other conducting wire 32 is electrically connected to the power layout areas 16, 26 via the corresponding circuit traces 13, 23 and the corresponding resistors 51B2, 52B2 to be acted as the power wire, or electrically connected to the ground layout areas 17, 27 via the corresponding circuit traces 13, 23 and the corresponding resistors 51B2, 52B2 to be acted as the ground wire.

Thus, the first circuit board 11 and the second circuit board 21 are disposed with multiple pairs of signal wires 33 and multiple conducting wires 32 on different surfaces thereof to increase the transmission capacity of the signal of the transmission cable 30.

The transmission cable structure of the disclosure is a cable structure conforming to USB, HDMI, or DisplayPort standard protocol. The inside of the transmission cable structure is provided with odd or even pairs of signal wires 33 and correspondingly disposed with odd or even conductor wires. When the transmission cable structure is applied to transmit the signal of USB standard protocol, the inside of the transmission cable structure is provided with even pairs of signal wires 33 and correspondingly disposed with even conductor wires. When the transmission cable structure is applied to transmit the signal of HDMI, DP, or SDP standard protocol, the inside of the transmission cable structure is provided with odd or even pairs of signal wires 33 and correspondingly disposed with odd or even conductor wires.

The above disclosure is only the preferred embodiment of the present invention and is not used for limiting the scope of the present invention. All equivalent variations and modifications based on shapes, structures, features, and spirits described in claims of the present invention should be included in the claims of the present invention.

The invention claimed is:

1. A transmission cable structure, comprising:
   a first circuit board including a first power layout area, a first ground layout area, a first power trace, and a first circuit trace;
   a second circuit board including a second power layout area, a second ground layout area, a second power trace, and a second circuit trace;
   a transmission cable disposed between the first circuit board and the second circuit board, the transmission cable including:
      a power wire, connected between the first power trace of the first circuit board and the second power trace of the second circuit board, and electrically connected to the first power layout area via the first power trace, and electrically connected to the second power layout area via the second power trace;
      a pair of signal wires connected between signal traces of the first circuit board and signal traces of the second circuit board;
      a conducting wire connected between the first circuit trace of the first circuit board and the second circuit trace of the second circuit board; and
      at least one braided metal wire, which is intertwined around the peripheries of the power wire, the conducting wire, and the pair of signal wires; wherein the first circuit board includes a first ground trace connected to the first ground layout area, the second circuit board includes a second ground trace connected to the second ground layout area, the braided metal wire is connected between the first ground trace of the first circuit board and the second ground trace of the second circuit board;
a first resistor configured between the first circuit trace and the first power layout area; and
a second resistor configured between the second circuit trace and the second power layout area.

2. The transmission cable structure according to claim 1, wherein the conducting wire is a drain wire.

3. The transmission cable structure according to claim 1, wherein the first resistor and the second resistor are zero-ohm resistors or resistors close to zero-ohm.

4. The transmission cable structure according to claim 1, wherein the transmission cable structure is a cable structure conforming to USB, HDMI, or Display Port standard protocol.

5. A transmission cable structure, including:
a first circuit board including a first power layout area, a first ground layout area, a first power trace, and a first circuit trace;
a second circuit board including a second power layout area, a second ground layout area, a second power trace, and a second circuit trace;
a transmission cable disposed between the first circuit board and the second circuit board, the transmission cable including:
a power wire, connected between the first power trace of the first circuit board and the second power trace of the second circuit board, and electrically connected to the first power layout area via the first power trace, and electrically connected to the second power layout area via the second power trace;
a pair of signal wires connected between signal traces of the first circuit board and signal traces of the second circuit board;
a conducting wire connected between the first circuit trace of the first circuit board and the second circuit trace of the second circuit board; and
at least one braided metal wire, which is connected to a shell of a connector that is grounded;
a first resistor configured between the first circuit trace and the first power layout area; and
a second resistor configured between the second circuit trace and the second power layout area.

6. A transmission cable structure, including:
a first circuit board including a first power layout area, a first ground layout area, a first power trace, and a first circuit trace;
a second circuit board including a second power layout area, a second ground layout area, a second power trace, and a second circuit trace;
a transmission cable disposed between the first circuit board and the second circuit board, the transmission cable including:
a power wire, connected between the first power trace of the first circuit board and the second power trace of the second circuit board, and electrically connected to the first power layout area via the first power trace, and electrically connected to the second power layout area via the second power trace;
a pair of signal wires connected between signal traces of the first circuit board and signal traces of the second circuit board;
a conducting wire connected between the first circuit trace of the first circuit board and the second circuit trace of the second circuit board; and
at least one braided metal wire, which is connected to a metal body that is grounded;
a first resistor configured between the first circuit trace and the first power layout area; and
a second resistor configured between the second circuit trace and the second power layout area.

7. A transmission cable structure, including:
a first circuit board including a first power layout area, a first ground layout area, a first power trace, and a first circuit trace;
a second circuit board including a second power layout area, a second ground layout area, a second power trace, and a second circuit trace;
a transmission cable disposed between the first circuit board and the second circuit board, the transmission cable including:
a power wire, connected between the first power trace of the first circuit board and the second power trace of the second circuit board, and electrically connected to the first power layout area via the first power trace, and electrically connected to the second power layout area via the second power trace;
a pair of signal wires connected between signal traces of the first circuit board and signal traces of the second circuit board;
a conducting wire connected between the first circuit trace of the first circuit board and the second circuit trace of the second circuit board; and
at least one braided metal wire, which is intertwined around the peripheries of the power wire, the conducting wire, and the pair of signal wires; wherein the first circuit board includes a first ground trace connected to the first ground layout area, the second circuit board includes a second ground trace connected to the second ground layout area, the braided metal wire is connected between the first ground trace of the first circuit board and the second ground trace of the second circuit board;
a first resistor configured between the first circuit trace and the first ground layout area; and
a second resistor configured between the second circuit trace and the second ground layout area.

8. The transmission cable structure according to claim 7, wherein the conducting wire is a drain wire.

9. The transmission cable structure according to claim 7, wherein the first resistor and the second resistor are zero-ohm resistors or resistors close to zero-ohm.

10. The transmission cable structure according to claim 7, wherein the transmission cable structure is a cable structure conforming to USB, HDMI, or Display Port standard protocol.

11. A transmission cable structure, including:
a first circuit board including a first power layout area, a first ground layout area, a first power trace, and a first circuit trace;
a second circuit board including a second power layout area, a second ground layout area, a second power trace, and a second circuit trace;
a transmission cable disposed between the first circuit board and the second circuit board, the transmission cable including:
a power wire, connected between the first power trace of the first circuit board and the second power trace of the second circuit board, and electrically connected to the first power layout area via the first power trace, and electrically connected to the second power layout area via the second power trace;

a pair of signal wires connected between signal traces of the first circuit board and signal traces of the second circuit board;

a conducting wire connected between the first circuit trace of the first circuit board and the second circuit trace of the second circuit board; and at least one braided metal wire, which is connected to a shell of a connector that is grounded;

a first resistor configured between the first circuit trace and the first ground layout area; and a second resistor configured between the second circuit trace and the second ground layout area.

12. A transmission cable structure, including:

a first circuit board including a first power layout area, a first ground layout area, a first power trace, and a first circuit trace;

a second circuit board including a second power layout area, a second ground layout area, a second power trace, and a second circuit trace;

a transmission cable disposed between the first circuit board and the second circuit board, the transmission cable including:

a power wire, connected between the first power trace of the first circuit board and the second power trace of the second circuit board, and electrically connected to the first power layout area via the first power trace, and electrically connected to the second power layout area via the second power trace;

a pair of signal wires connected between signal traces of the first circuit board and signal traces of the second circuit board;

a conducting wire connected between the first circuit trace of the first circuit board and the second circuit trace of the second circuit board; and at least one braided metal wire, which is connected to a metal body that is grounded;

a first resistor configured between the first circuit trace and the first ground layout area; and a second resistor configured between the second circuit trace and the second ground layout area.

13. A transmission cable structure, including:

a first circuit board including at least one first power layout area, at least one first ground layout area, at least one first power trace, and a plurality of first circuit traces;

a second circuit board including at least one second power layout area, at least one second ground layout area, at least one second power trace, and a plurality of second circuit traces;

a transmission cable including:

a power wire, connected between the first power trace and the second power trace, and electrically connected to the corresponding first power layout area via the first power trace, and electrically connected to the corresponding second power layout area via the second power trace;

a plurality of pairs of signal wires, each of the plurality of pairs of signal wires is connected between signal traces of the first circuit board and signal traces of the second circuit board;

a plurality of conducting wires, each of the plurality of conducting wires is connected between the corresponding first circuit trace and the corresponding second circuit trace; and at least one braided metal wire, which is intertwined around the peripheries of the power wire, the conducting wire, and the pair of signal wires; wherein the first circuit board includes a first ground trace connected to the first ground layout area, the second circuit board includes a second ground trace connected to the second ground layout area, the braided metal wire is connected between the first ground trace of the first circuit board and the second ground trace of the second circuit board;

a plurality of first resistors, each of the plurality of first resistors is selectively configured to be placed in one of an interval between the corresponding first circuit trace and the corresponding first power layout area and an interval between the corresponding first circuit trace and the corresponding first ground layout area; and a plurality of second resistors, each of the plurality of second resistors is selectively configured to be placed in one of an interval between the corresponding second circuit trace and the corresponding second power layout area and an interval between the corresponding second circuit trace and the corresponding second ground layout area.

14. The transmission cable structure according to claim 13, wherein the first circuit board and the second circuit board are provided with a first surface and a second surface, respectively; the plurality of pairs of signal wires and the plurality of conducting wires are all connected between the first surface of the first circuit board and the first surface of the second circuit board.

15. The transmission cable structure according to claim 13, wherein the first circuit board and the second circuit board are provided with a first surface and a second surface, respectively; at least one of the plurality of pairs of signal wires and at least one of the plurality of conducting wires are connected between the first surface of the first circuit board and the first surface of the second circuit board; other pairs of signal wires and other conducting wires are connected between the second surface of the first circuit board and the second surface of the second circuit board.

16. The transmission cable structure according to claim 13, where the plurality of conducting wires are drain wires.

17. The transmission cable structure according to claim 13, wherein the plurality of first resistors and the plurality of second resistors are zero-ohm resistors or resistors close to zero-ohm.

18. The transmission cable structure according to claim 13, wherein the transmission cable structure is a cable structure conforming to USB, HDMI, or Display Port standard protocol.

* * * * *